United States Patent
Parkhill et al.

(10) Patent No.: US 6,793,502 B2
(45) Date of Patent: Sep. 21, 2004

(54) PRESS (NON-SOLDERED) CONTACTS FOR HIGH CURRENT ELECTRICAL CONNECTIONS IN POWER MODULES

(75) Inventors: Scott Parkhill, Perrysburg, OH (US); Sayeed Ahmed, Canton, MI (US); Fred Flett, Bloomfield, MI (US)

(73) Assignee: Ballard Power Systems Corporation, Dearborn, MI (US)

( * ) Notice: Subject to any disclaimer, the term of this patent is extended or adjusted under 35 U.S.C. 154(b) by 24 days.

(21) Appl. No.: 09/957,047

(22) Filed: Sep. 20, 2001

(65) Prior Publication Data

US 2002/0111050 A1 Aug. 15, 2002

Related U.S. Application Data

(60) Provisional application No. 60/233,995, filed on Sep. 20, 2000, provisional application No. 60/233,996, filed on Sep. 20, 2000, provisional application No. 60/233,993, filed on Sep. 20, 2000, provisional application No. 60/233,992, filed on Sep. 20, 2000, and provisional application No. 60/233,994, filed on Sep. 20, 2000.

(51) Int. Cl.$^7$ .......................... H01R 12/00; H05K 1/00
(52) U.S. Cl. ........................ 439/66; 439/76.2; 361/141
(58) Field of Search .................. 439/66, 76.2; 363/144, 363/141; 307/147

(56) References Cited

U.S. PATENT DOCUMENTS

| | | | |
|---|---|---|---|
| 4,661,897 A | 4/1987 | Pitel | 363/17 |
| 4,674,024 A | 6/1987 | Paice et al. | 363/71 |
| 5,184,291 A | 2/1993 | Crowe et al. | 363/37 |
| 5,459,356 A | 10/1995 | Schulze et al. | 257/773 |
| 5,508,560 A | 4/1996 | Koehler et al. | 257/730 |
| 6,072,707 A | 6/2000 | Hochgraf | 363/71 |
| 6,078,173 A | 6/2000 | Kumar et al. | 324/158.1 |
| 6,212,087 B1 | 4/2001 | Grant et al. | 363/144 |
| 2002/0034088 A1 | 3/2002 | Parkhill et al. | 363/144 |

*Primary Examiner*—Hae Moon Hyeon
(74) *Attorney, Agent, or Firm*—Seed IP Law Group PLLC

(57) ABSTRACT

An electrical connector for use in a power module includes a first end portion for forming an electrical connection with a substrate, a second end portion, and a compliant portion situated between the first end portion and the second end portion. The compliant portion includes a compressed position and a decompressed position. The first end portion is configured for forming an electrical connection with a substrate if the compliant portion is in the compressed position.

15 Claims, 15 Drawing Sheets

SECTION A-A

SECTION B-B

SECTION C-C

SECTION B-B

SECTION A-A

SECTION C-C'

SECTION D-D'

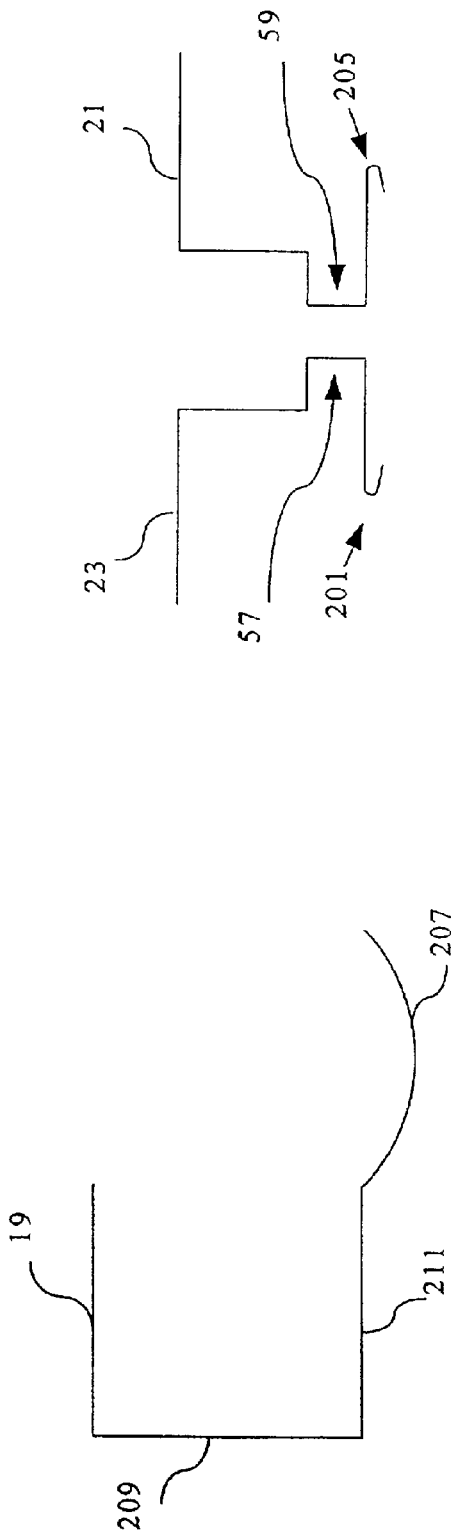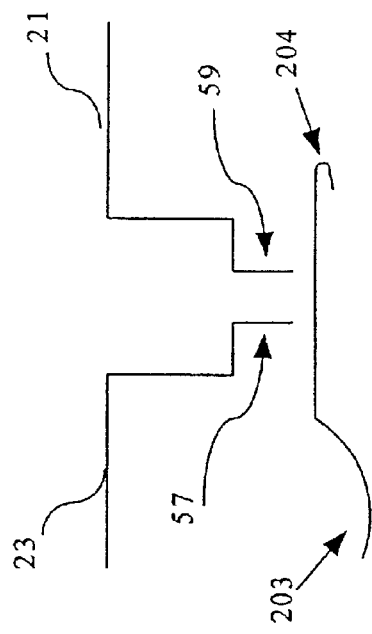

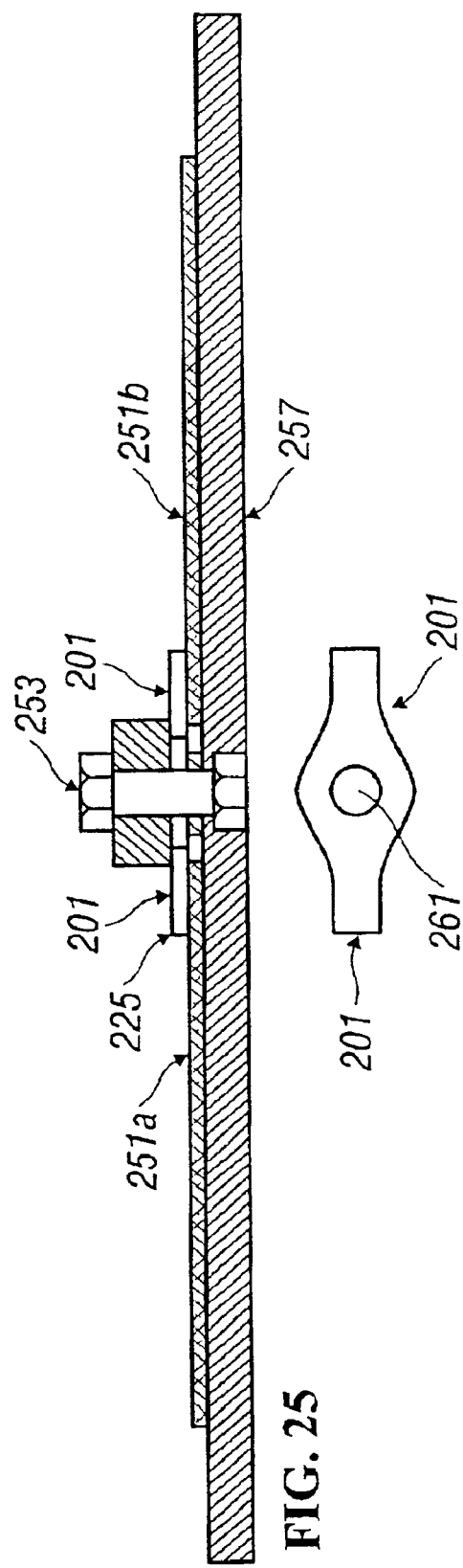

PRESS (NON-SOLDERED) CONTACTS FOR HIGH CURRENT ELECTRICAL CONNECTIONS IN POWER MODULES

CROSS REFERENCE TO RELATED APPLICATIONS

This application is related to and claims the benefit of U.S. Provisional Application No. 60/233,995, filed Sep. 20, 2000, and entitled, "Leadframe-Based Module DC Bus Design to Reduce Module Inductance," U.S. Provisional Application No. 60/233,996, filed Sep. 20, 2000, and entitled, "Substrate-Level DC Bus Design to Reduce Module Inductance," U.S. Provisional Application No. 60/233,993, filed Sep. 20, 2000, and entitled, "EMI Reduction in Power Modules Through the Use of Integrated Capacitors on the Substrate Level," U.S. Provisional Application No. 60/233,992, filed Sep. 20, 2000, and entitled, "Press (Non-Soldered) Contacts for High Current Electrical Connect, Ions in Power Modules," and U.S. Provisional Application No. 60/233,994, filed Sep. 20, 2000, and entitled, "Both-Side Solderable Power Devices to Reduce Electrical Interconnects." Each of the above applications is hereby incorporated by reference herein in its entirety.

BACKGROUND OF THE INVENTION

1. Field of the Invention

The invention relates to the field of electronics. More specifically, the invention relates to electric connections used in power modules.

2. Background of the Invention

An inverter is commonly used to convert direct current ("DC") to alternating current ("AC") to power a three-phase load, such as a three-phase motor, or, alternatively, to convert AC from a three-phase source to DC. The inverter commonly contains six switches. Power modules often contain one or more pairs of complementary switches. The power module typically includes silicon dice on substrates that are secured to the module baseplate. Each switching pair has a positive or "high" side switch and a negative or "low" side switch for controlling the flow of electric current. Each switching pair is referred to herein as a "half bridge." The "high side" of the bridge contains the positive switches, and the "low side" contains the negative switches. By the term "switch" is meant a switching device such as an insulated gate bipolar transistor ("IGBT") or Bipolar Junction Transistor ("BJT") or Metal Oxide Semiconductor Field Effect Transistor ("MOSFET"), either singly or in parallel.

Elements may be described herein as "positive" or "negative." An element described as "positive" is shaped and positioned to be at a higher relative voltage than elements described as "negative" when the power module is connected to a power source. "Positive" elements are positioned to have an electrical connection that is connectable to the positive terminal of a power source, while "negative" elements are positioned to have an electrical connection that is connectable to a negative terminal, or ground, of the power source. Generally, "positive" elements are located or connected to the high side of the power module and "negative" elements are located or connected to the low side of the power module.

In a typical power module configuration, the high side switches are on one side of the module opposite the corresponding low side switches. A positive DC lead from a power source such as a battery is connected to a conducting layer in the high side of the substrate. Likewise, a negative DC lead from the power source is connected to a conducting layer in the low side of the substrate. The high side switches control the flow of current from the conducting layers of each high side substrate to output leads. Output leads, called "phase terminals" transfer alternating current from the three pairs of switches, or half bridges, to the motor.

Power modules typically have three half bridges combined into a single three-phase switching module, or single half-bridge modules that may be linked together to form a three-phase inverter. As would be understood by one of ordinary skill in the art, the same DC to AC conversion may be accomplished using any number of half bridges, which correspond to a phase, and each switching pair may contain any number of switching devices. For simplicity and clarity, all examples herein use a common three phase/three switching pair configuration. However, the invention disclosed herein may be applied to a power module having any number of switches.

Current flows from the power source through the positive DC lead to the conducting layer on the high side substrate. Current is then permitted to flow through one or more switching device on the high side to a conducting layer, commonly referred to as a phase output layer, on the low side. A phase terminal lead allows current to flow from this conducting layer on the low side to the motor. The current then flows from the motor to the corresponding conducting layer on the low side of a second switching pair through the low side switches and diodes to the negative DC lead to the power source.

Current flowing through various inductive paths within the module transiently stores energy which increases energy loss, reduces efficiency, generates heat. When the flow of current changes, as in such a high frequency switching environment, large voltage overshoots often result, further decreasing efficiency. In addition, the DC terminals are commonly attached to one end of the power module, which forces current to travel further to some switches for some switching configurations, than for others, resulting in non-uniform current loops. Current loops that are not uniform result in uneven or inefficient motor performance. Additional materials regarding efficient configurations of power modules may be found in application Ser. No. 09/957,568 filed herewith), entitled "Substrate-Level DC Bus Design to Reduce Module Inductance," application Ser. No. 09/957,001, filed herewith), entitled "EMI Reduction in Power Modules Through the Use of Integrated Capacitors on the Substrate Level," and application Ser. No. 09/882,708 entitled "Leadframe-based Module DC Bus Design to Reduce Module Inductance" which are hereby incorporated by reference in their entirety.

Present inverter power module designs typically require wire bonding or direct soldering of power terminals or jumpers to obtain acceptably high current carrying capacity with minimal contact resistance. However, soldering large terminals and wire bonding are energy intensive and time consuming manufacturing operations.

These and other problems are avoided and numerous advantages are provided by the device described herein.

BRIEF SUMMARY OF THE INVENTION

The present invention provides an electrical connector for use in a power module that utilizes a press contact to avoid the use of wire bonding or direct soldered contacts. Such electrical connectors are useful in power modules where power module components, such as the DC bus, are incorporated into the power module to reduce voltage overshoots and increase switching efficiency. Connections are made between various components in the power module by pressing a connector between two components.

Elements may be described herein as "adjacent" to another element. By the term "adjacent" is meant that in a relationship so characterized, the components are located proximate to one another, but not necessarily in contact with each other. Normally there will be an absence of other components positioned in between adjacent components, but this is not a requirement. By the term "substantially" is meant that the orientation is as described, with allowances for variations that do not affect the cooperation and relationship of the so described component or components.

In one aspect the present invention, an electrical connector for use in a power module includes a first end portion for forming an electrical connection with as substrate, a second end portion, and a compliant portion situated between the first and second end. The compliant portion includes a compressed position and a decompressed position. The first end portion is configured for forming an electrical connection with a substrate if the compliant portion is in the compressed position.

In another aspect, the first end portion extends outward from the second end portion. In yet another aspect, the first end portion extends inward from the second end portion. In still another aspect, the compliant portion is curved.

In one aspect of the invention, the electrical connector includes a system for compressing the compliant portion from the uncompressed position to a compressed position. In one embodiment, the system includes downward pressure applied to the compliant portion. In another embodiment, the system includes a component placed on the second end portion for exerting downward pressure to the compliant portion. In yet another embodiment, the system includes a fastener.

In yet another aspect, the present invention is directed to a DC bus for use in a power module. The DC bus includes a positive DC conductor bus plate and a negative DC conductor bus plate. A connector is fastenable from at lease one of the positive or negative DC conductor bus plates. The connector includes a first end portion for forming an electrical connection with as substrate, a second end portion, and a compliant portion situated between the first and second end. The compliant portion includes a compressed position and a decompressed position. The first end portion is configured for forming an electrical connection with a substrate if the compliant portion is in the compressed position.

The connector and DC Bus disclosed herein provide a connection between electrical components in a power module that does not require wire bonding or soldering. The invention provides for relatively easy assembly and reduced cost of manufacture. The invention may be utilized in any power module configuration. However, the present invention is particularly useful in power modules where power module components, such as the DC bus, are incorporated into the power module to reduce voltage overshoots and increase switching efficiency.

These and other advantages will become apparent to those of ordinary skill in the art with reference to the detailed description and drawings.

BRIEF SUMMARY OF THE DRAWINGS

FIG. 18 is a side view of the connection between the phase terminal and the substrate.

FIG. 19 is a side view of the connection between the DC bus and the substrate.

FIG. 20 is a side view of the connection between the phase conducting layers in the power module.

FIG. 25 is a cross-sectional view of an embodiment of a connector.

FIG. 26 is a top plan view of an embodiment of a connector.

DETAILED DESCRIPTION OF THE INVENTION

In an embodiment in accordance with the invention, a connector includes a compliant portion. When the compliant portion is in a compressed position, an electrical connection may be made between a substrate and a first end portion of the connector. Reference is made herein to a power module with three phase terminals for use with a three-phase motor and having three bridges, each with two switching pairs. As will be appreciated by one of ordinary skill in the art, the disclosed connectors and DC bus could be used on a power module with any number of phase terminals and bridges, and having any number of switching pairs. Nonetheless, for ease of description, reference is made to a three-phase power module.

Figure 1:
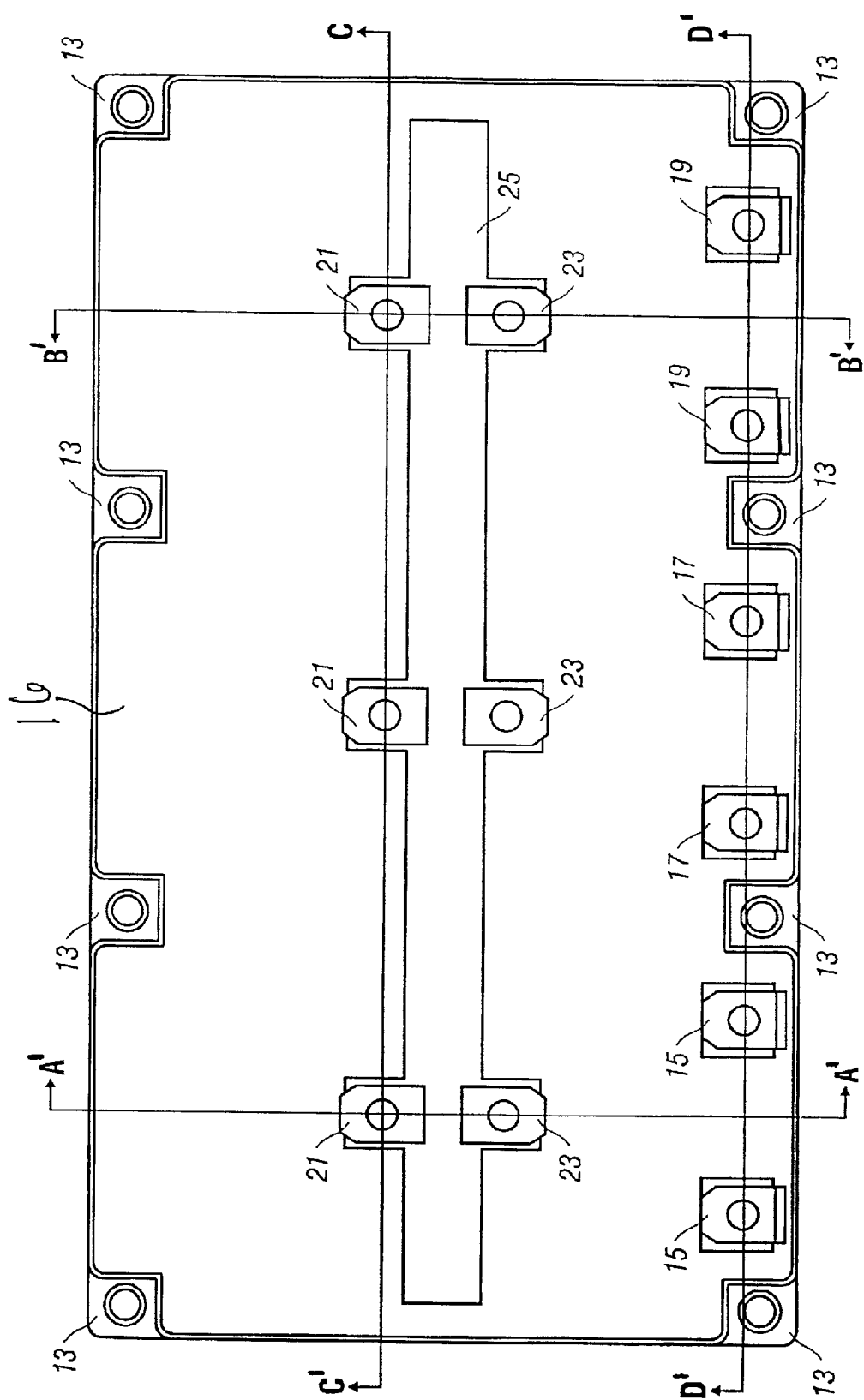
FIG. 1 is an overhead view of the top of the power module.

Referring to FIG. 1, an overhead view of the top of the power module is shown. The module has three positive leads 21 that are connectable to a power source, such as a battery, and three negative leads 23 that are likewise connectable to the negative terminal of a power source such as a battery, or ground. The module has three sets of phase terminals 15, 17, and 19. The cover 16 power module is held in place by adhesive. The module is attached to a coolant header or mounting by fasteners (not shown) through bushings 13. The fasteners are bolts, but other types of fasteners can be substituted therefore, as will be readily apparent to those of ordinary skill in the art. A non-conducting strip 25 holds leads 21 and 23 in place by providing a raised portion into which the leads 21 and 23 may be bolted.

As will be understood by one of ordinary skill in the art, the positive leads 21 and negative leads 23 carry direct current from a battery source to the module. As will be better understood by the following discussion, the power module converts the direct current to alternating current, or alternating current to direct current. In a three-phase module such as that shown in FIG. 1, there are at lease three phase terminals 15, 17 and 19 through which the resulting alternating current flows. In the preferred embodiment, there are three sets of two phase terminals 15, 17, and 19.

Figure 2:
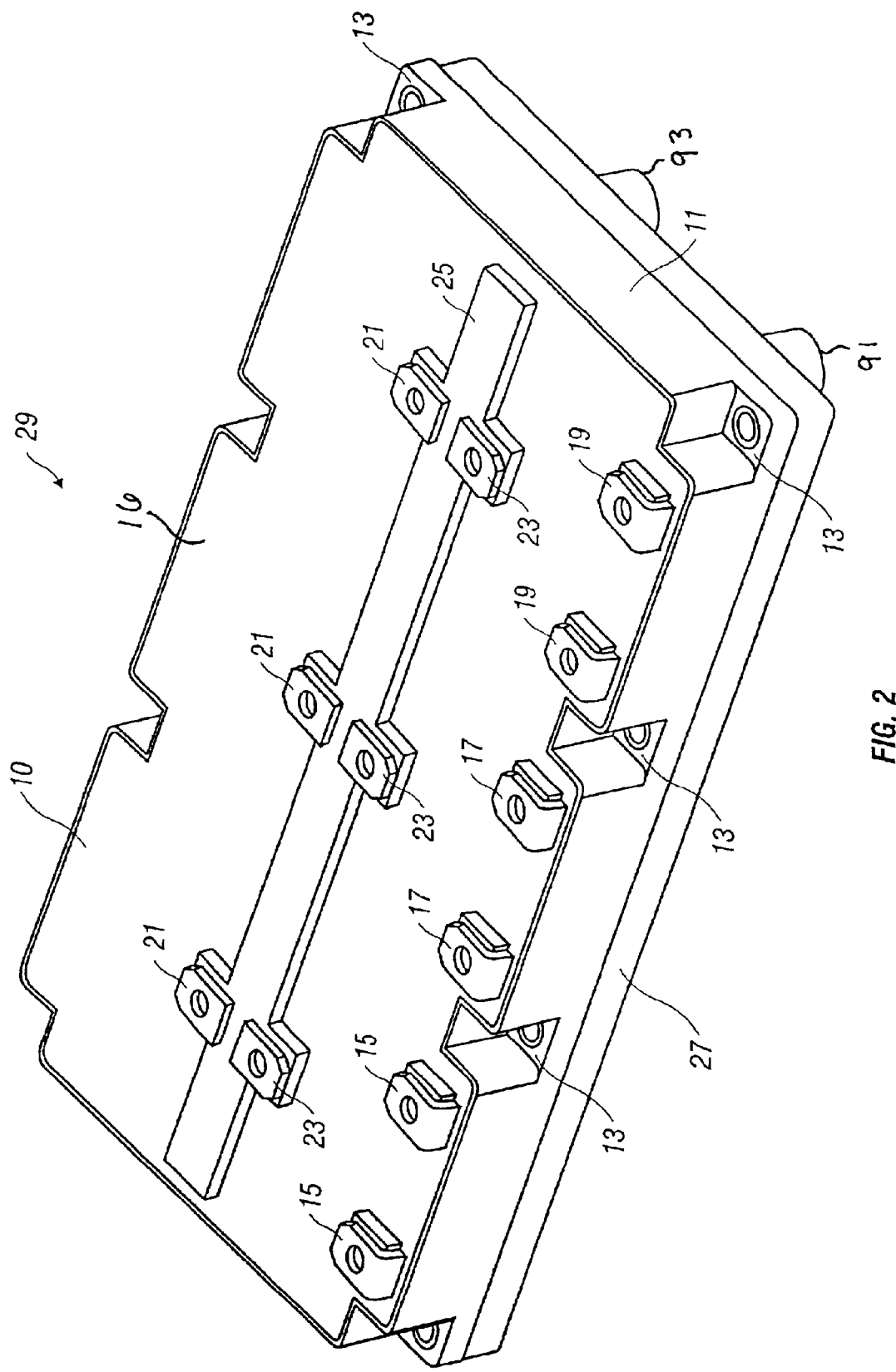
FIG. 2 is a perspective view of the power module.

FIG. 2 is a perspective view of the power module 29. The module has a module frame 11 and top cover 10, which are preferably composed of plastic. The bottom portion is the cooling header 27 of the module, into which a cooling liquid enters, circulates through, and exits, for cooling the module. Sandwiched between the module frame 11 and the cooling header 27 middle portion is the base plate, which contains the printed circuit board, substrate, and switching devices, and is not shown in this view. FIG. 2 shows the positive leads 21 and negative leads 23, and phase terminals 15, 17, and 19. The module frame 11 is bolted to the cooling header 27 with bolts through bushings 13.

Figure 3:
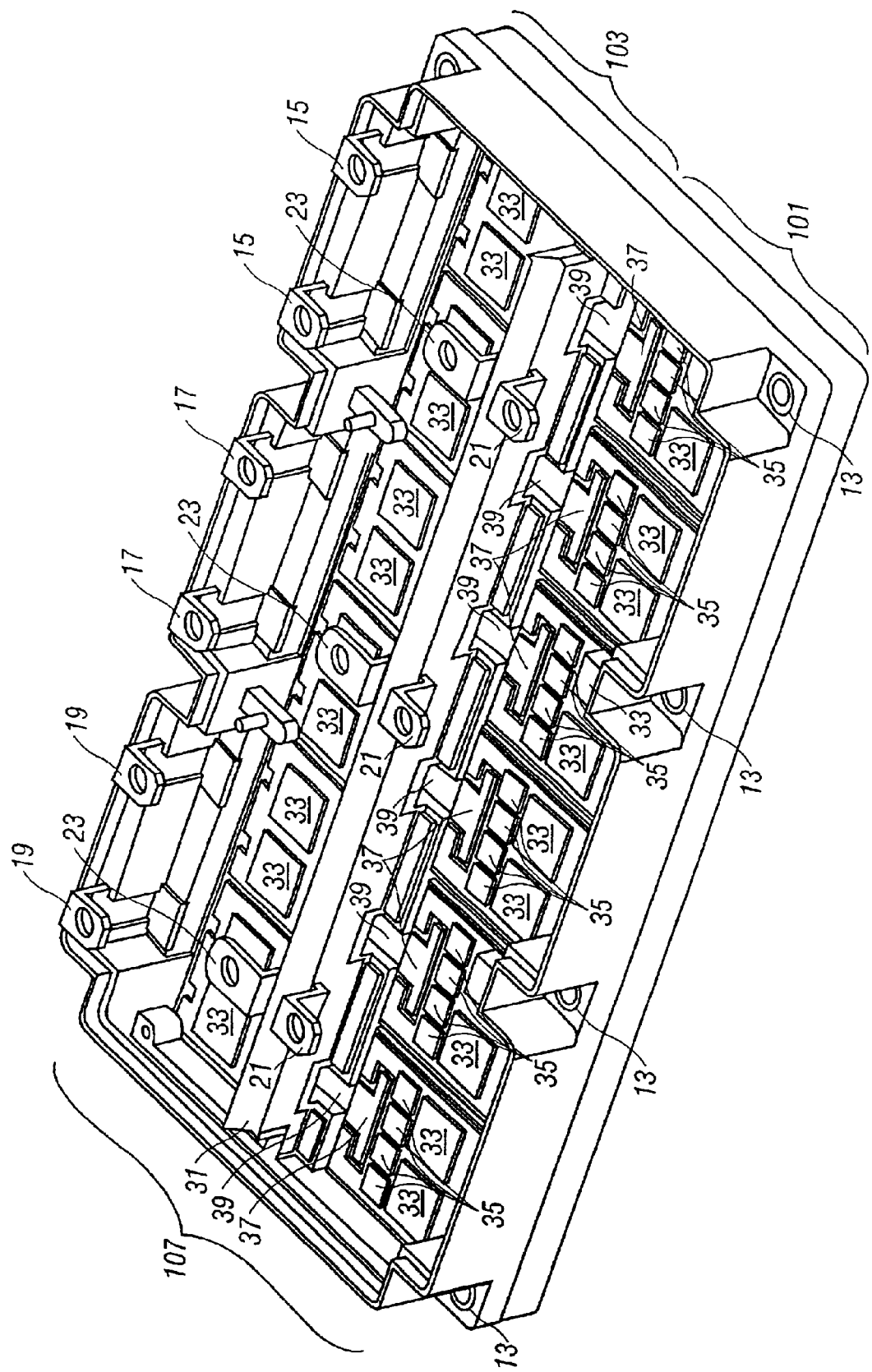
FIG. 3 is a perspective view of the power module without its top portion and with the substrates exposed.

FIG. 3 is a perspective view of the power module, shown without its top cover portion 10 and with the printed circuit board removed. The power module in FIG. 3 is configured for wire bond or soldered connectors between the various electrical components. The DC bus 31 has a separate positive bus plate and a negative bus plate, as is better illustrated in FIGS. 7–8, and 9–11, 19 and 20. The DC bus 31 is arranged perpendicular to the substrate 107. As would be understood by one of ordinary skill in the art, the substrate has conducting layers separated by an insulating layer for carrying and controlling a current flow. The substrate 107 has a high side 101 and a low side 103. Switches 33, which can be IGBTs, MOS, or MOSFETs, and diodes 35 for controlling current flow are electrically connected to the substrate 107. The switches 33 are preferably IGBTs. The switches 33 and diodes 35 are electrically connected, preferably by wire bonding.

As will be understood by one of ordinary skill in the art, direct current flows from a power source such as a battery to the positive DC leads 21 and to the DC conductor bus plates 31. Current flows to a conducting layer in the high side 101 of the power module. The current flows through the switches 33 and diodes 35 on the high side 101 through a conducting plate 37. The conducting plate 37 is connected to a conducting layer in the low side 103 of the power module by a connection located through a cut-out passage 39 underneath the bus bar. Current then flows from the conducting layer on the low side 103 through one of the sets of phase terminals 15, 17, or 19 to a three-phase motor (not shown). Current from the motor flows back to another set of phase terminals 15, 17, or 19, where it flows from the conducting layer on the low side 103 through the low side switches 33, 35 to the negative lead 23 of the bus bar 31 and back to the power source.

FIG. 3 also shows pairs of phase terminals 15, 17, and 19. Three single phase terminals may be substituted for phase terminal pairs 15, 17, and 19. Alternatively, each phase terminal grouping, shown as pairs 15, 17, and 19, may include more than two phase terminals. Pairs of phase terminals 15, 17, and 19 are used for ease of connecting to switches 33 on the high side 103 of the power module.

Three positive DC leads 21 and three negative DC leads 23 are also shown. Each lead 21 and 23 is placed central to a switching substrate corresponding to each of the phase terminals 15, 17, or 19. Although other lead configurations are possible, this placement of DC leads 21 and 23 provides for more uniform current flow as opposed to previous modules having only a single DC lead.

Figure 4:
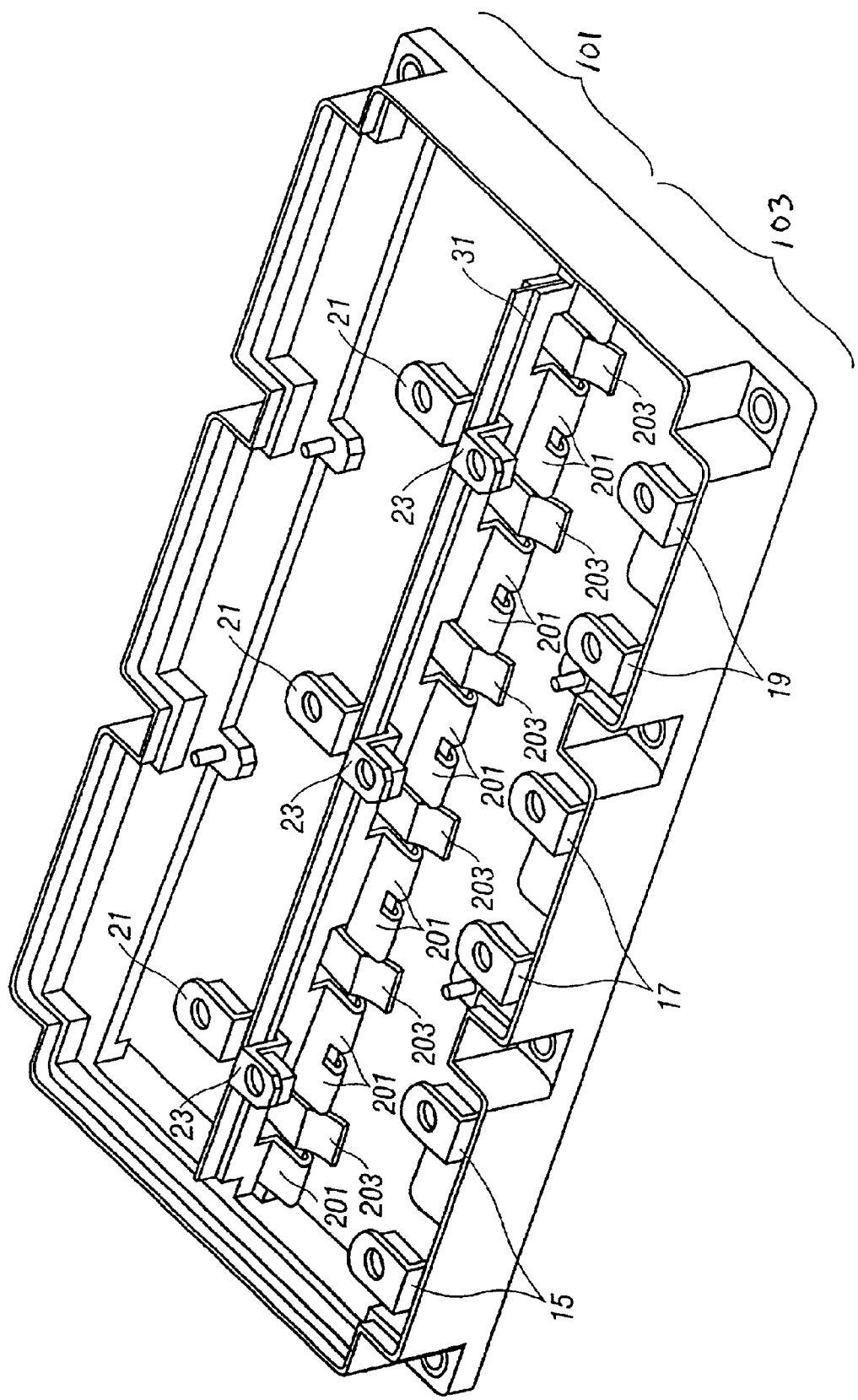
FIG. 4 is a perspective view of the power module with the substrate removed.

FIG. 4 is a perspective view of the leadframe, shown with the substrate removed and with connectors for making an electrical connection according to the present invention that avoid wire bonding and soldering techniques. Phase terminals 15, 17, and 19 and leads 21 and 23 are shown.

The DC bus 31 is placed in the center of the module, however, other configurations are possible. Connectors 203 are configured to connect the phase conducting layers of the high side 101 and low side 103 substrates. Connectors 201 are electrically connected to the DC Bus 31 for forming an electrical connection to the low side 103 of the substrate.

Figure 5:
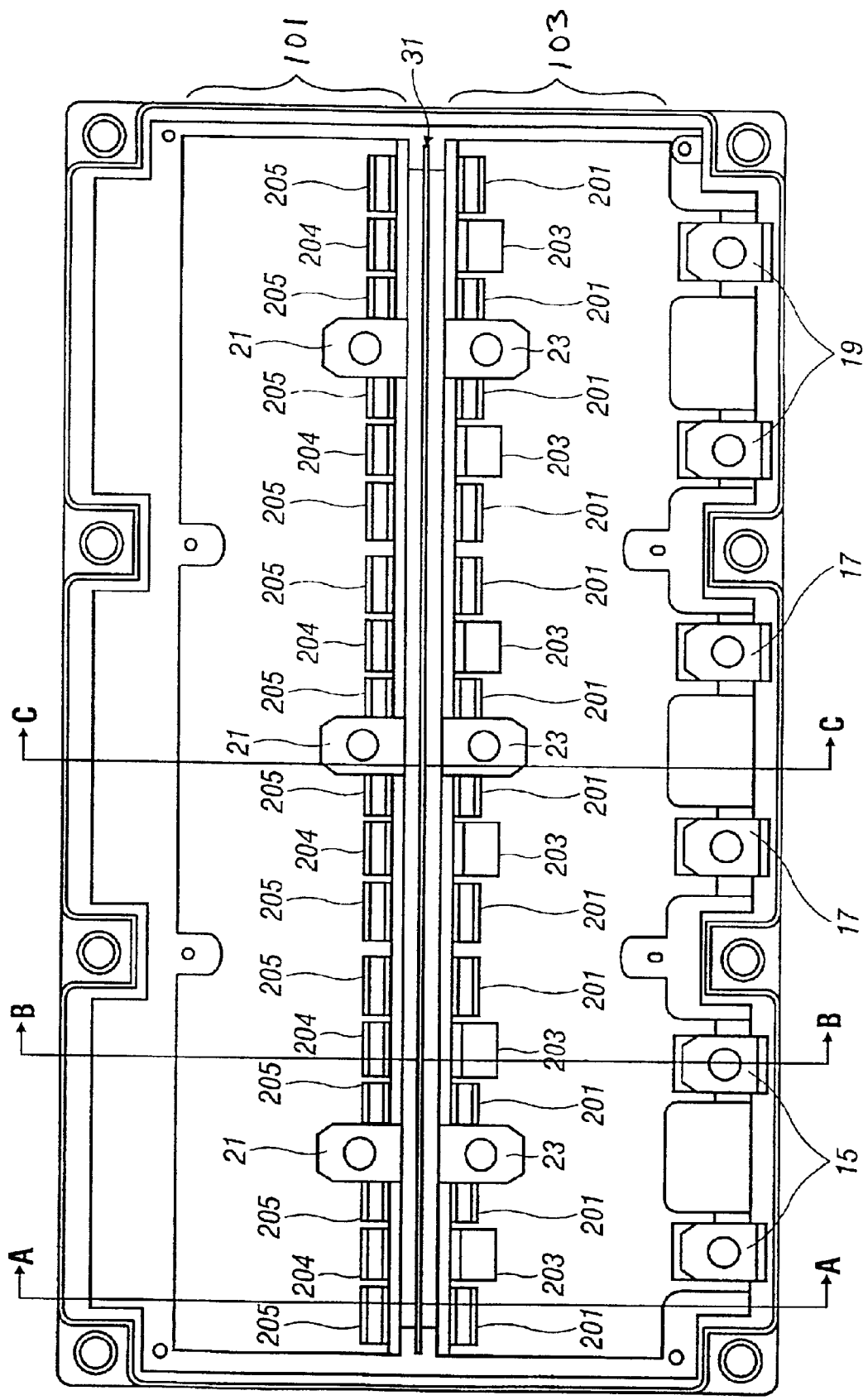
FIG. 5 is an overhead view of the power module with the substrate removed.

FIG. 5 is an overhead view of the leadframe shown with the substrate removed. Phase terminals 15, 17 and 19, positive leads 21, and negative leads 23 are shown. Connectors 203 and 204, which are joined together, are placed for connecting phase conducting layers between the high side 101 and the low side 103 of the substrate. Connectors 201 are placed for connecting the negative DC bus plate of the DC bus 31 to the low side 103 of the substrate. Connectors 205 are placed for connecting the positive DC bus plate of the DC bus 31 to the high side 101 of the substrate.

Figure 6:
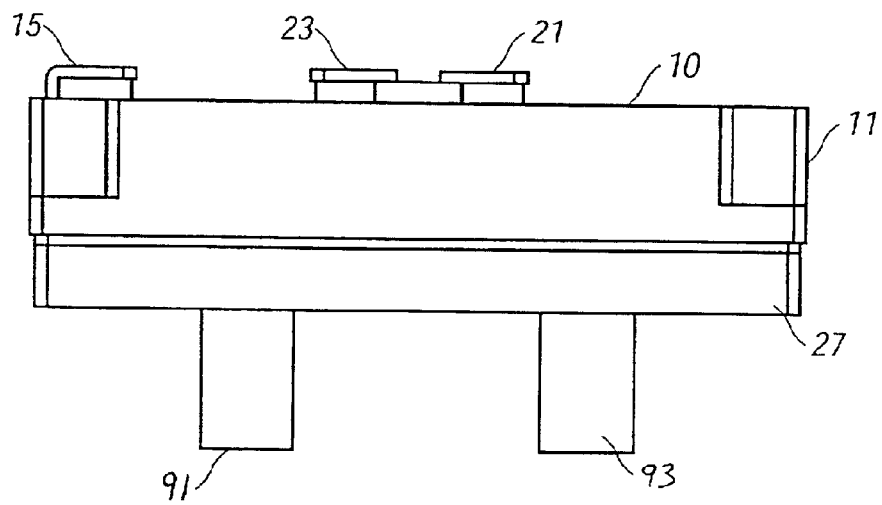
FIG. 6 is a side view of a power module configured for wire bonded or soldered connections.
Figure 7:
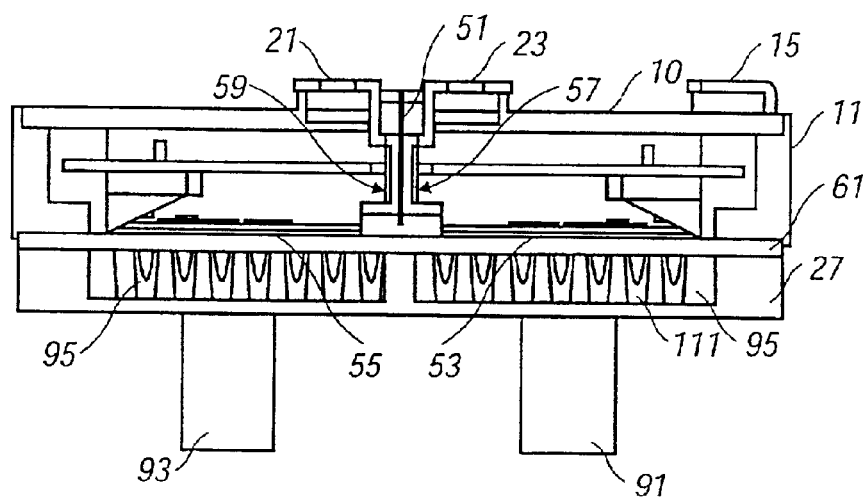
FIG. 7 is a side view of a power module configured for wire bonded or soldered connections.
Figure 8:
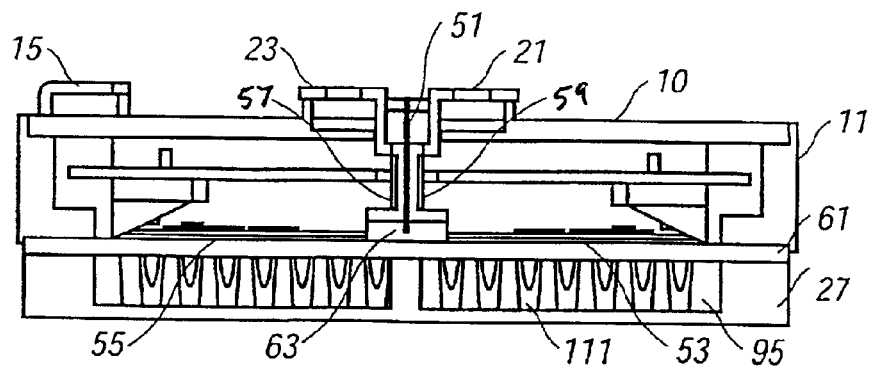
FIG. 8 is a side view of a power module configured for wire bonded or soldered connections.

FIGS. 6, 7, and 8 are side views of a power module configured for wire bonded or soldered connections.

FIG. 6 is a side view of the power module, with DC leads 21 and 23, phase terminal 15, and module frame 11. The bottom cooling header 27 includes an intake for coolant 91 and an outlet for coolant 93.

Referring now to FIG. 7, a cross-sectional front view of the power module with cooling intake 91 and outlet 93 is shown. The cooling header 27 includes a cavity 95 through which a coolant, such as water, may flow. The cavity 95 includes thermal conducting projections 111. The cooling header 27 is fastened to the base plate 61, which supports the high side switching assembly 55 and low side switching assembly 53. The high side switching assembly 55 and low side switching assembly 53 comprise a single half bridge. The phase terminal 15 is also shown. FIG. 7 illustrates the cross section of the DC bus at the point having DC leads 21 and 23. The DC bus has a positive conductor plate 59 arranged parallel to a negative conductor plate 57. An electrically insulating layer 51, preferably made from plastic or tape, is placed between the positive bus plate 59 and the negative bus plate 57. Alternatively, enough space may be left between the plates 57 and 59 to provide an insulating layer of air or silicone gel. The electrically insulating layer 51 permits more uniform spacing and closer spacing between the positive and negative buses, 59 and 57, respectively.

Thus, counter flow of current is permitted, thereby canceling the magnetic fields and their associated inductances. In addition, the parallel bus plates 57 and 59 create capacitance. As will be understood by one of ordinary skill in the art, a capacitor dampens voltage overshoots that are caused by the switching process. Thus, the DC bus plates 57 and 59 create a magnetic field cancellation as a result of the counter flow of current, and capacitance damping as a result of also establishing a functional capacitance between them. FIG. 5 shows the DC bus plates 57 and 59 placed perpendicular to the high side substrate 55 and low side substrate 53, however, the DC bus plates 57 and 59 may also be placed parallel to the substrates 53 and 55 and still achieve counter flow of current and reduced inductances.

The cooling system is further illustrated in FIG. 7. Heat produced by the power module is conducted through the base plate 61 and the conducting projections 111 to the coolant cavities 95. Coolant flows into the coolant intake 91, through the cavities 95, and out coolant outlet 93, thereby dissipating heat energy from the power module.

Referring now to FIG. 8, a cross-sectional front view of the power module without cooling intake and out take is shown.

In contrast to FIGS. 6, 7, and 8, FIGS. 9, 10, and 11 are side views of a power module configured for solderless connections with the substrate removed.

Figure 9:
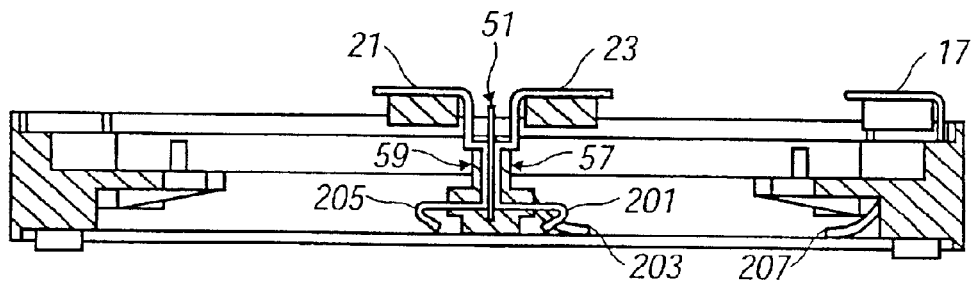
FIG. 9 is a side view of a power module configured for solderless connections.
Figure 10:
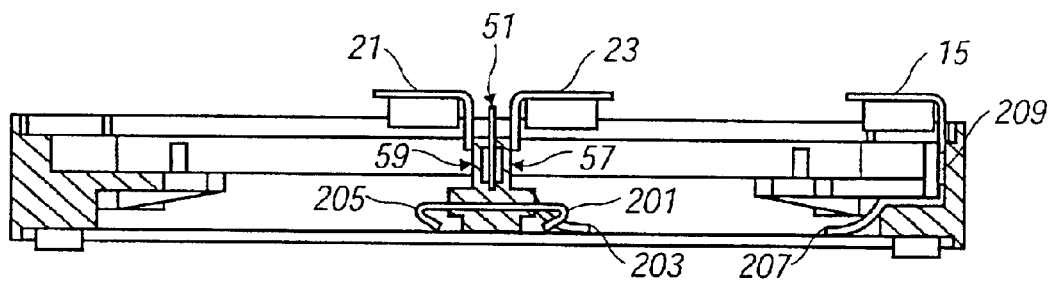
FIG. 10 is a side view of a power module configured for solderless connections.
Figure 11:
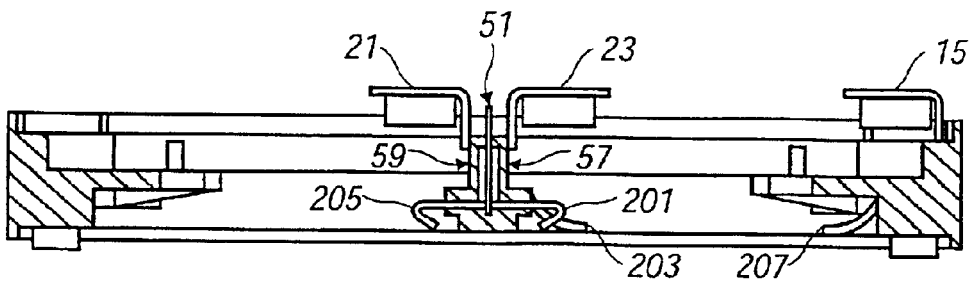
FIG. 11 is a side view of a power module configured for solderless connections.

Referring to FIGS. 9, 10, and 11, positive terminal 21, negative terminal 23, and phase terminal 17 are shown. The positive phase terminal 21 is electrically connected to a positive DC bus plate 59, and the negative phase terminal 23 is electrically connected to a negative DC bus plate 57. The positive DC bus plate 59 and the a negative DC bus plate 57 are separated by an insulating layer 51.

Connectors 201, 203, 204, 205 and 207 are configured for forming an electrical connection to the substrate of the power module. Connector 207 electrically connects phase terminal 17 to the substrate, connector 205 electrically connects the positive DC bus plate 59 to the substrate, and connector 201 electrically connects the negative DC bus plate 57 to the substrate. Connectors 203 and 204 electrically connects the phase conducting layers between the substrates.

FIG. 10 illustrates the electrical connection between phase terminal 15 and connector 207. Specifically, the phase terminal 15 is connected to connection 207 by a vertical plate 209 for electrical connection.

Figure 12:
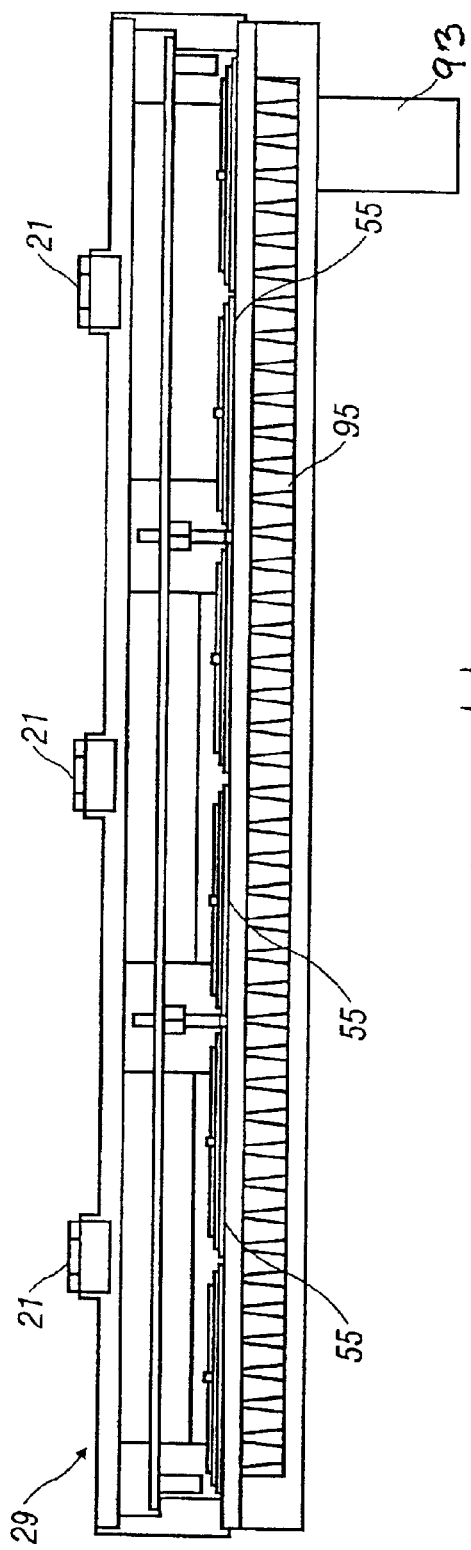
FIG. 12 is a cross-sectional side view of the power module view through the DC bus. Terminals.

Turning now to FIG. 12, a cross-sectional side view of the power module viewed through the DC bus terminals is shown. The coolant cavity 95 runs the length of the module to outtake 93. The high side substrate switches 55 are shown inside the module 29 with positive DC leads 21.

Figure 13:
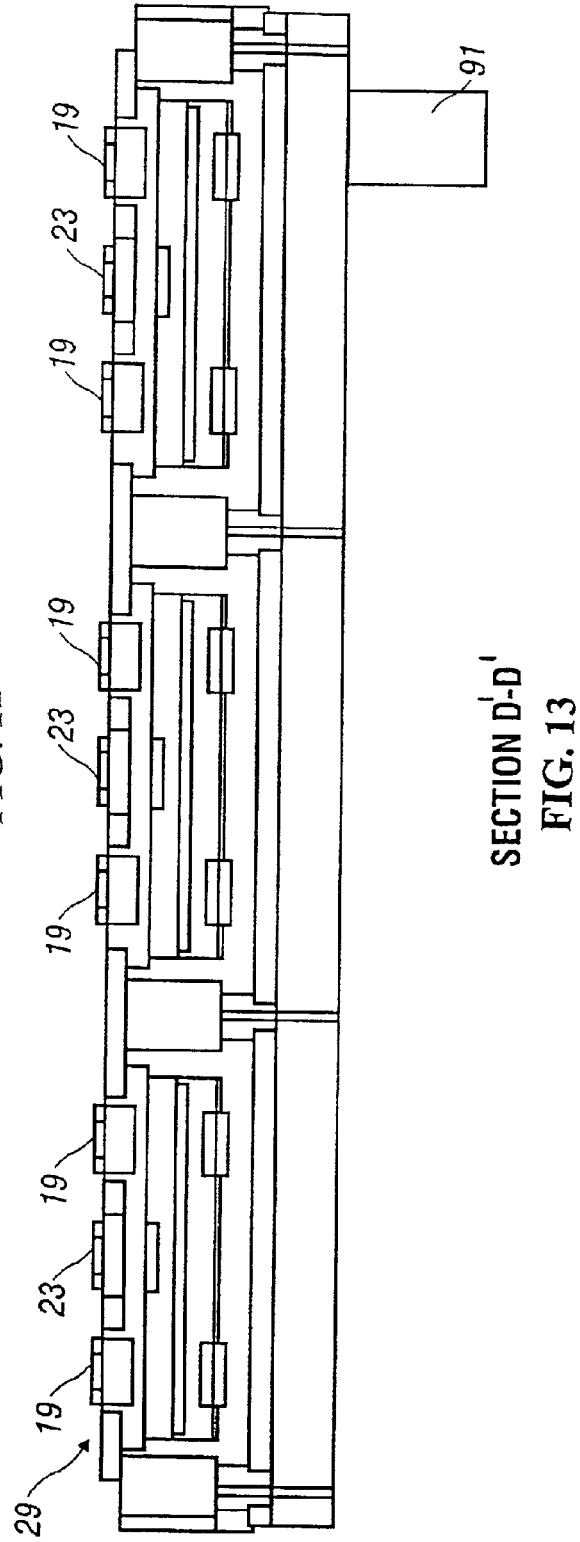
FIG. 13 is a cross-sectional side view of the power module.

FIG. 13 is a cross-sectional side view of the power module viewed through the phase terminals 15, 17, and 19 and depicting negative DC bus leads 23.

Figure 14:
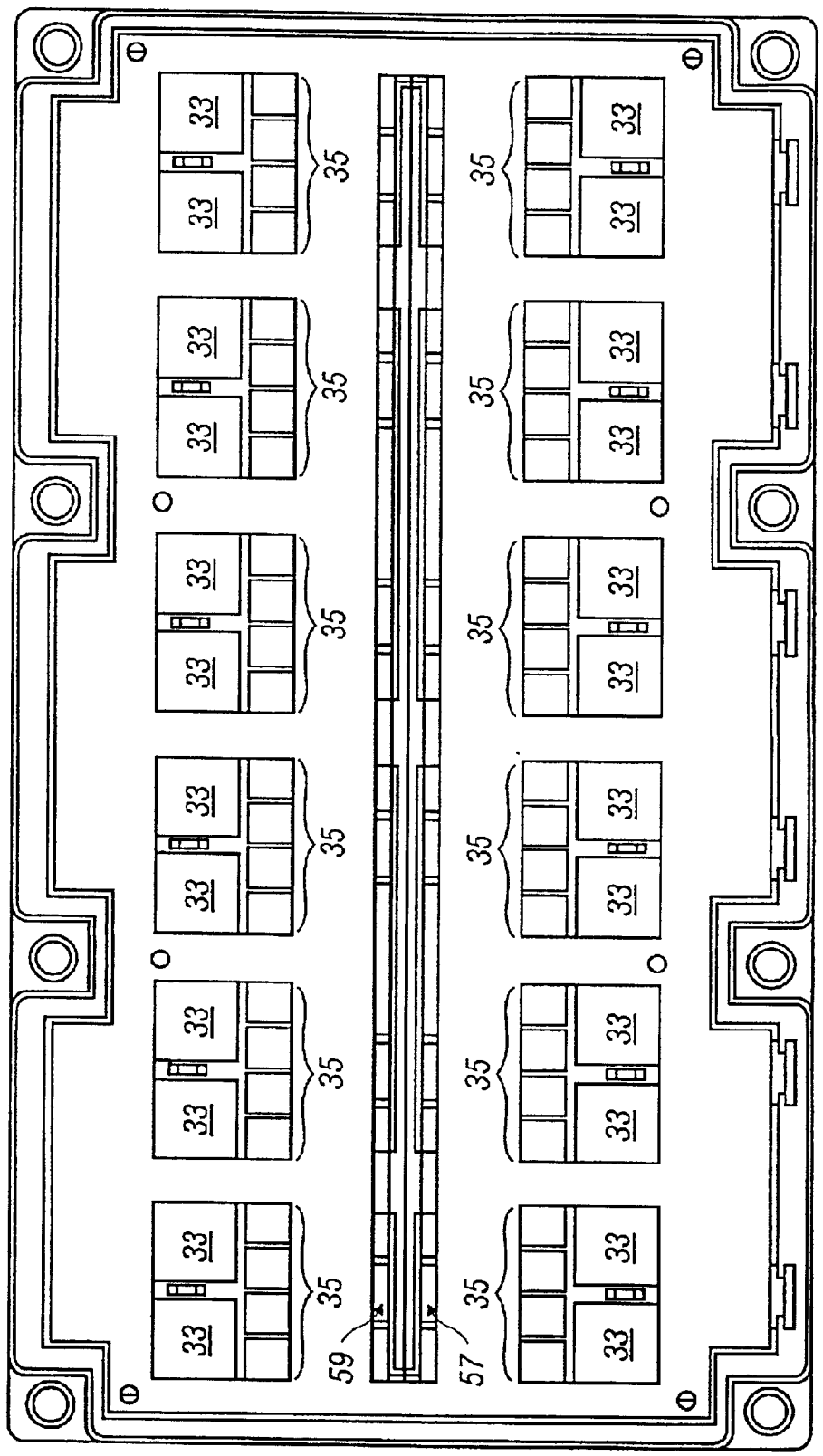
FIG. 14 is a top sectional view of the printed circuit board.

FIG. 14 is a top section view of the printed circuit board illustrating switching devices 33 and diodes 35 on the substrate of the module as viewed through cutouts in the printed circuit board. The positive DC bus plate 59 and the negative DC bus plate 57 are also shown in the horizontal section.

Figure 15:
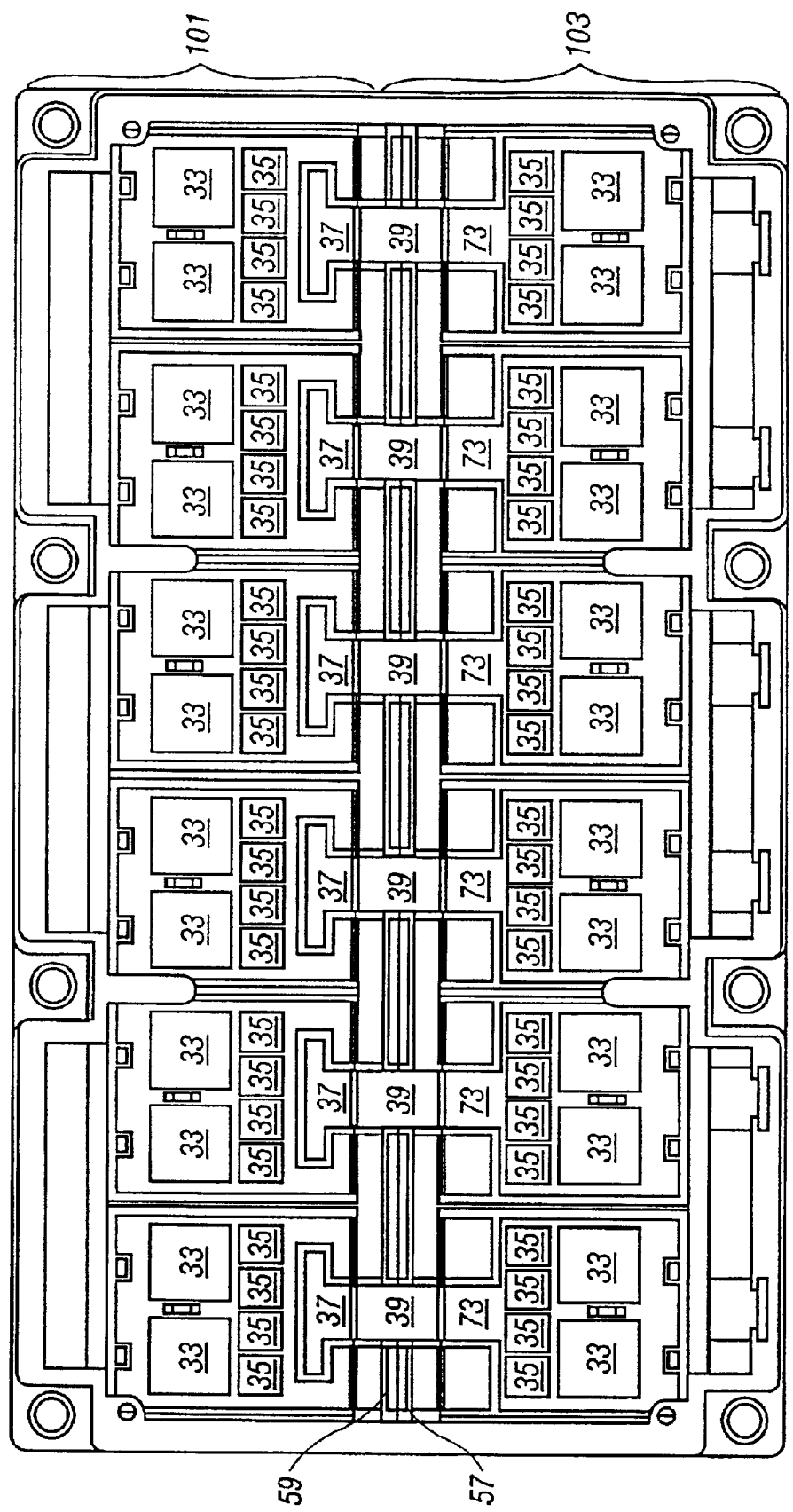
FIG. 15 is a top section view of the power module below the printed circuit board.

Referring now to FIG. 15, a top section view of the module below the printed circuit board is shown. The positive DC bus plate 59 and the negative DC bus plate 57 are allowed to extend into a low side slot in the middle of the module cover. The DC bus plate has openings for a passage 39 from the high side 101 to the low side 103. Switches 33 and diodes 35 are shown on a substrate. As stated in the discussion accompanying FIG. 3, the current must be able to flow from the conducting layer on the high side 101 of the substrate to the conducting layer on the low side 103 of the substrate. The current flows from a conducting layer of the substrate on the high side 101, through the switches 33 and diodes 35 to the conducting plate 37. The conducting plate 37 is connected through the passage 39 to a plate 73 on the low side 103 of the module.

Figure 16:
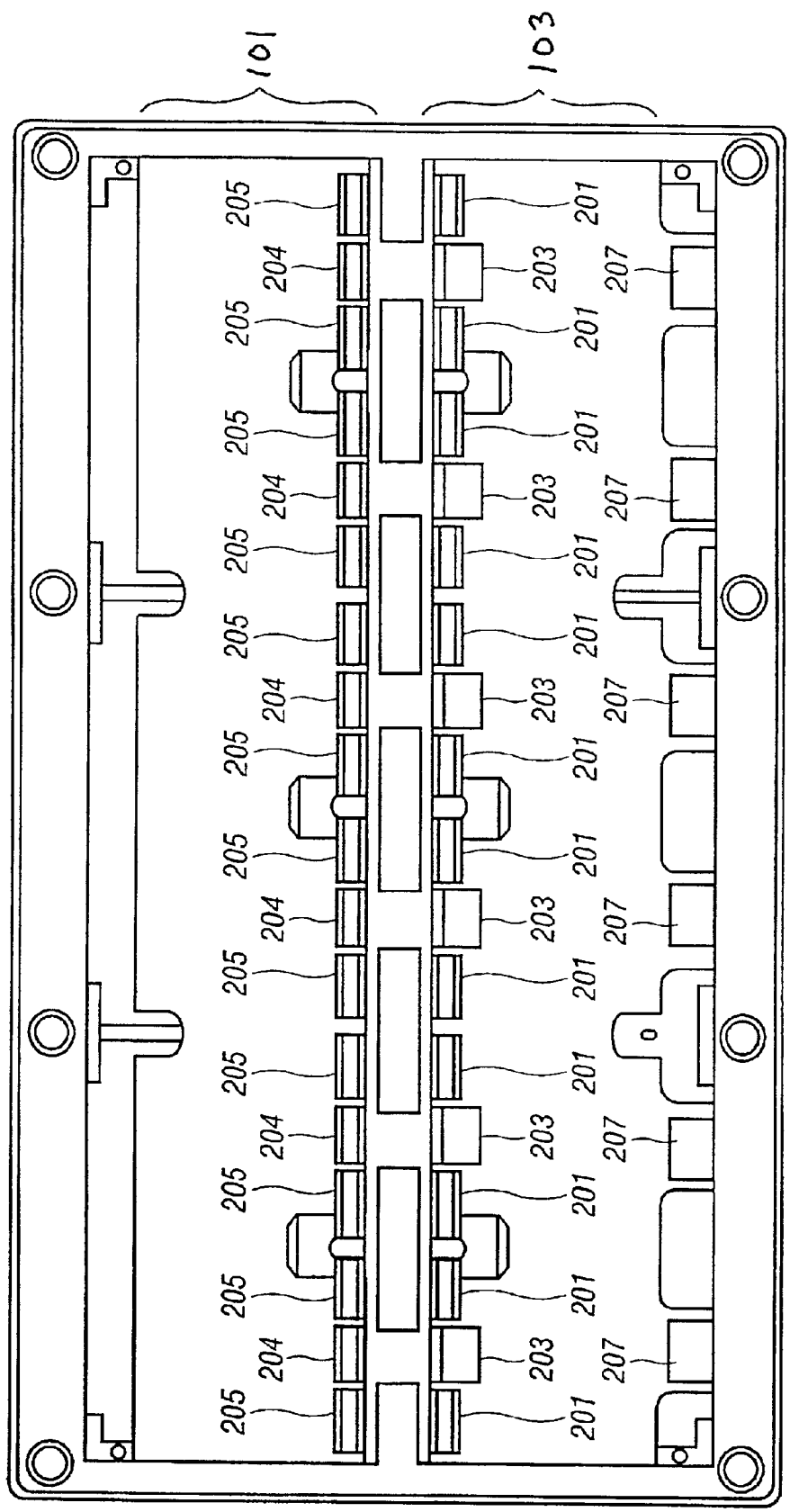
FIG. 16 is a bottom view of the leadframe.

Referring now to FIG. 16, a bottom view of the power module is shown. Connectors 203 and 204 electrically connect the phase conducting layer of the high side 101 of the substrate and the low side 103 of the substrate. Connectors 207 electrically connect phase terminals (not shown in FIG. 16) to the substrate. Connectors 201 electrically connect the negative DC bus plate (not shown in FIG. 16) to the substrate, and connectors 205 electrically connect the positive DC bus plate (not shown in FIG. 16) to the substrate.

Figure 17:
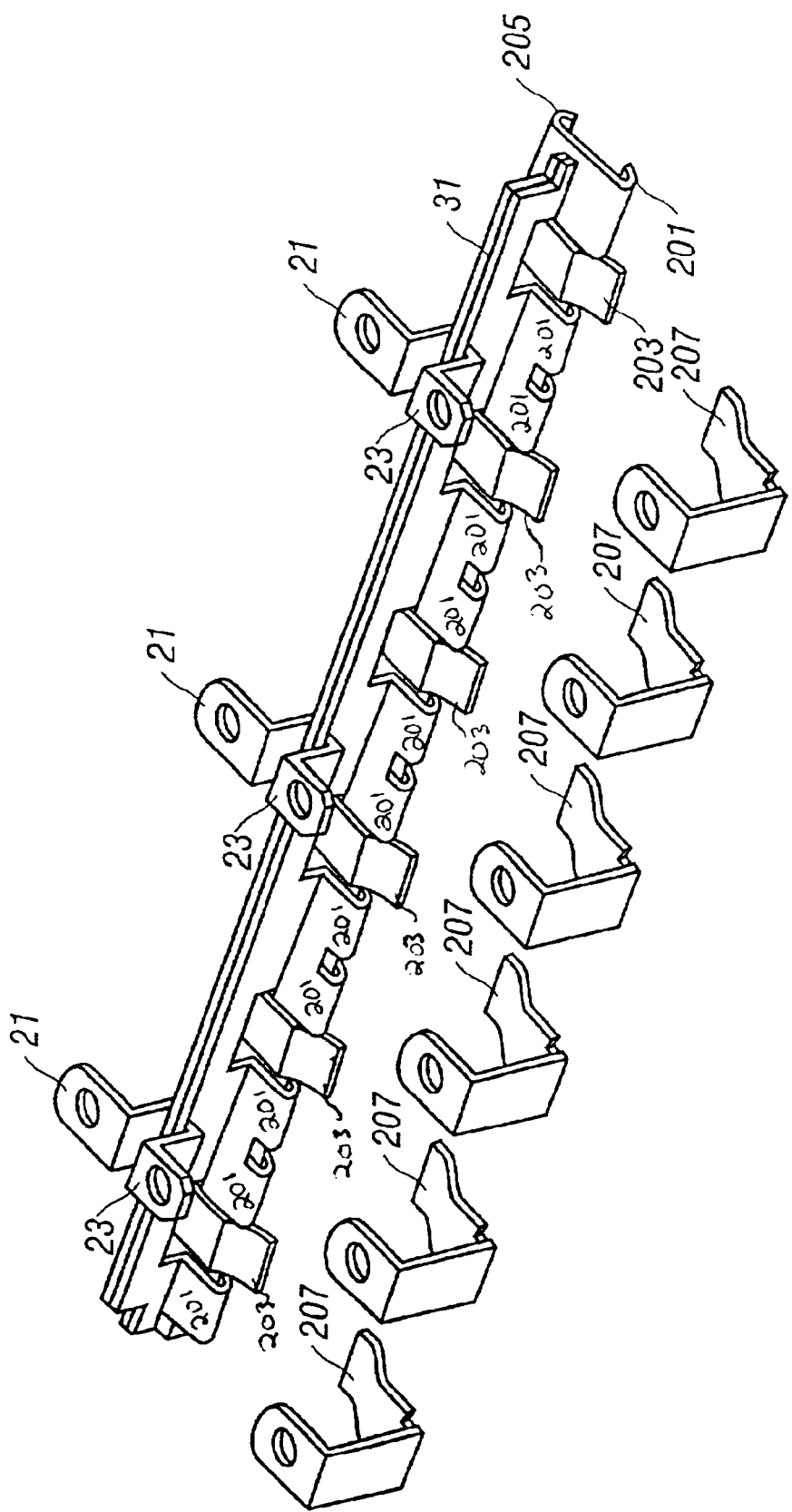
FIG. 17 is a perspective view of the DC bus and phase terminals.

FIG. 17 is a perspective view of the DC bus and phase terminals. Phase terminals 15, 17, and 19 are connected by vertical plate 209 to connectors 207. Positive leads 21 and negative leads 23 are shown connected to the DC bus 31. Connector 205 is electrically connected to the negative bus plate (not shown in FIG. 17) of the DC bus 31 for forming a connection with a substrate. Connector 201 is electrically connected to the positive bus plate 59 for forming a connection with a substrate. Connector 203 is positioned to form a connection between the phase conducting layers on either side of the DC bus 31.

FIG. 18 is a side view of the connection between the phase terminal and the substrate. Phase terminal 19 is connected by a vertical plate 209 and a horizontal plate 211 to connector 207. Connector 207 is configured for placement on a substrate.

FIG. 19 is a side view of the connection between the DC bus and the substrate. Positive DC terminal 21 is electrically connected to positive bus plate 59, which in turn, is electrically connected to connector 205. Negative DC terminal 23 is electrically connected to negative DC bus plate 57, which is electrically connected to connector 201. When placed in a power module, connectors 205 and 201 electrically connect with a substrate.

FIG. 20 is a side view of the connection between the phase conducting layers in the power module. The phase conducting layers of the power module are conducting plates 37 and 73 shown in FIG. 15. Referring back to FIG. 20, positive DC terminal 21 is electrically connected to positive DC bus plate 59, and negative DC terminal 23 is electrically connected to negative DC bus plate 57. However, the positive DC bus plate 59 and the negative DC bus plate 57 are not electrically connected to connectors 203 and 204. Connectors 203 and 204 form a connection passing under the positive DC bus plate 59 and the negative DC bus plate 57. When placed in a power module, the configuration of connectors 203 and 204 allow a connection between the phase conducting layer of both sides of the power module.

Figure 21:
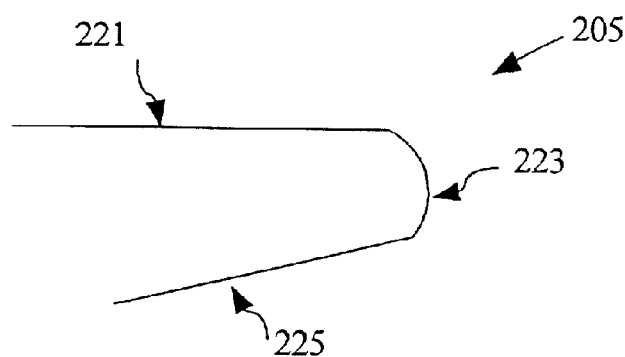
FIG. 21 is a side view of a connector in a decompressed position.

FIG. 21 is a side view of a connector in a decompressed position. The connector 205 includes a first end portion 225 for forming an electrical connection with a substrate and a second end portion 221. The connector 205 includes a compliant portion 223. In the embodiment shown in FIG. 21, the compliant portion 223 and the first end portion 225 extend inward from the second end portion 221. The compliant portion 223 is curved.

Figure 22:
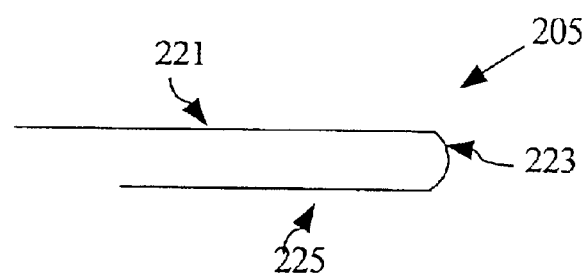
FIG. 22 is a side view of a connector in a compressed position.

FIG. 22 is a side view of a connector in a compressed position. The connector 205 includes a first end portion 225 for forming an electrical connection with a substrate and a second end portion 221. The connector 205 includes a compliant portion 223. The curvature of the compliant portion 223 is greater in the compressed position illustrated in FIG. 22 than in the decompressed position shown in FIG. 21.

Figure 23:
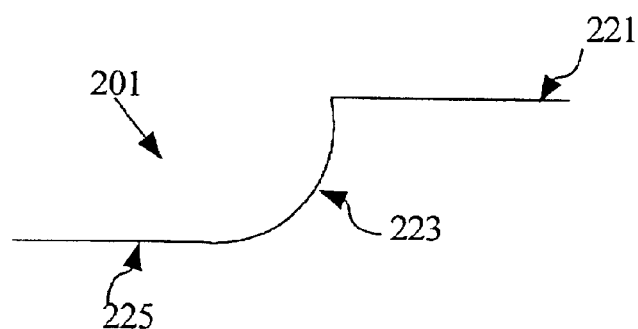
FIG. 23 is a side view of a connector in a decompressed position.

FIG. 23 is a side view of a connector in a decompressed position. The connector 201 includes a first end portion 225 for forming an electrical connection with a substrate and a second end portion 221. The connector 201 includes a compliant portion 223. In the embodiment shown in FIG. 21, the compliant portion 223 and the first end portion 225 extend outwards from the second end portion 221. The compliant portion 223 is curved.

Figure 24:
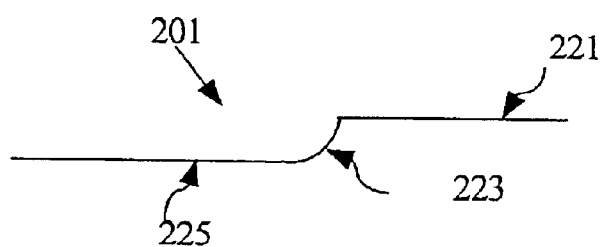
FIG. 24 is a side view of a connector in a compressed position.

FIG. 24 is a side view of a connector in a compressed position. The connector 201 includes a first end portion 225 for forming an electrical connection with a substrate and a second end portion 221. The connector 201 includes a compliant portion 223. The curvature of the compliant portion 223 is greater in the compressed position illustrated in FIG. 23 than in the decompressed position shown in FIG. 24.

In one embodiment, the compliant portion 223 illustrated in FIGS. 21–24 may be moved from the decompressed positions shown in FIGS. 21 and 23 to the compressed positions shown in FIGS. 22 and 24 by downward pressure applied to the compliant portion. The downward pressure may be applied directly to the compliant portion, or indirectly from any part of the connector. For example, power module components, such as the module top or the DC bus plate, may be fitted against the connector to force the connector from a compressed position to a decompressed position.

FIG. 25 is a cross sectional view of an embodiment of the invention. Two connectors 201 form an electrical connection between a first substrate 251a and a second substrate 251b. The substrate is supported by a base plate 257. A fastener 253 is fastened on top of the connectors 201. The connectors 201 are held in a compressed position by the fastener 253. The fastener 253 may be a threaded fastener, such as a bolt and a screw.

FIG. 26 is a top plan view of an embodiment of a connector 201. The connector 201 includes an opening 261 through which a fastener may be placed.

The figures disclosed herein are merely exemplary of the invention, and the invention may be embodied in various and alternative forms. The figures are not necessarily to scale. Some features may be exaggerated or minimized to show details of particular components. Therefore, specific structural and functional details disclosed herein are not to be interpreted as limiting, but merely as a basis for the claims and as a representative basis for teaching one skilled in the art to variously employ the present invention.

Having thus described the invention, the same will become better understood from the appended claims in which it is set forth in a non-limiting manner.

What is claimed is:

1. A DC Bus for use in a power module, the DC Bus comprising:
    (a) a first conductive element comprising:
        (i) a first end portion for forming an electrical connection with a substrate;
        (ii) a second end portion;
        (iii) an intermediate portion situated between the first and second end portions; and
        (iv) a compliant portion, deformable between a compressed position and a decompressed position,
    wherein, when the compliant portion is in the compressed position, the first end portion is biased into physical engagement with the substrate to form an electrical connection with a first contact on the substrate and the second end portion is unbiased and electrically couplable to form a non-pressure engagement electrical connection with a first conductive terminal; and
    (b) a second conductive element comprising:
        (i) a first end portion for forming an electrical connection with the substrate;
        (ii) a second end portion;
        (iii) an intermediate portion situated between the first and second end portions; and
        (iv) a compliant portion, deformable between a compressed position and a decompressed position,
    wherein, when the compliant portion is in the compressed position, the first end portion is biased into physical engagement with the substrate to form an electrical connection with a second contact on the substrate and the second end portion is unbiased and electrically couplable to form a non-pressure engagement electrical connection with a second conductive terminal, and
    wherein the intermediate portions of the first and second conductive elements form positive and negative DC conductor bus plates, respectively, and are substantially parallel to, and separated from, each other.

2. The DC Bus of claim 1, wherein the first end portions extend outward from the second end portions.

3. The DC Bus of claim 1, wherein the first end portions extend inward to the second end portions.

4. The DC Bus of claim 1, wherein the compliant portions are curved.

5. The DC Bus of claim 1, wherein the compliant portions are curved outward from the second end portions.

6. The DC Bus of claim 1, wherein the compliant portions are curved inward to the second end portions.

7. The DC Bus of claim 1, further comprising a means for compressing the complaint portions from the decompressed positions to the compressed positions.

8. The DC Bus of claim 7, wherein the means for compressing is a means for applying pressure to the compliant portions.

9. The DC Bus of claim 7, wherein the means for compressing is a component placed on the second end portions for applying pressure to the compliant portions.

10. The DC Bus of claim 7, wherein the non-pressure engagement electrical connections are made via fasteners.

11. The DC Bus of claim 10, wherein the fastener is a bolt.

12. The DC Bus of claim 1, wherein the compliant portion of the first conductive element is situated between the first end portion and the second end portion of the first conductive element.

13. The DC Bus of claim 1, wherein the compliant portion of the second conductive element is situated between the first end portion and the second end portion of the second conductive element.

14. The DC Bus of claim 1, further comprising an insulator received between the intermediate portions of the first and second conductive elements.

15. The DC Bus of claim 1, further comprising a dielectric received between the intermediate portions of the first and second conductive elements.

* * * * *